United States Patent
Hamada

(10) Patent No.: US 8,395,437 B2
(45) Date of Patent: Mar. 12, 2013

(54) CHARGE PUMP CIRCUIT AND SEMICONDUCTOR INTEGRATED CIRCUIT

(75) Inventor: Takeshi Hamada, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 58 days.

(21) Appl. No.: 12/865,585

(22) PCT Filed: Aug. 25, 2009

(86) PCT No.: PCT/JP2009/064767
§ 371 (c)(1),
(2), (4) Date: Jul. 30, 2010

(87) PCT Pub. No.: WO2010/032589
PCT Pub. Date: Mar. 25, 2010

(65) Prior Publication Data
US 2011/0001554 A1    Jan. 6, 2011

(30) Foreign Application Priority Data
Sep. 17, 2008 (JP) .................................. 2008-237473

(51) Int. Cl.
*G05F 3/02* (2006.01)
*G05F 1/10* (2006.01)

(52) U.S. Cl. ............. 327/536; 327/535; 363/59; 363/60

(58) Field of Classification Search .................. 327/535, 327/536
See application file for complete search history.

(56) References Cited

U.S. PATENT DOCUMENTS

| | | | | |
|---|---|---|---|---|
| 5,396,114 A | * | 3/1995 | Lee et al. | 327/535 |
| 5,550,728 A | * | 8/1996 | Ellis | 363/60 |
| 6,198,341 B1 | * | 3/2001 | Ryu | 327/536 |
| 7,023,262 B2 | * | 4/2006 | Sim et al. | 327/541 |
| 7,208,995 B2 | * | 4/2007 | Hashimoto | 327/536 |
| 2005/0057300 A1 | * | 3/2005 | Ishii | 327/536 |

(Continued)

FOREIGN PATENT DOCUMENTS

| | | |
|---|---|---|
| JP | 2001-309400 | 11/2001 |
| JP | 2005-020922 | 1/2005 |

(Continued)

*Primary Examiner* — Ryan Jager
(74) *Attorney, Agent, or Firm* — Morgan, Lewis & Bockius LLP

(57) ABSTRACT

Provided is a charge pump circuit which is preferably used for reducing noise generated when electric charges are accumulated in a capacitor of the charge pump circuit. A load driving system 1 includes a charge pump circuit 2, a clock generation circuit 4, an amplifier circuit 6, and a load 8. The charge pump circuit 2 includes capacitors C1 and C2, a transistor PTr3 which is a P-channel MOS transistor and controls current supply to the C1, switching elements SW1 to SW3, and a supply current control circuit 20. The charge pump circuit 2 switches the SW1 to SW3, to thereby perform the accumulation of electric charges to the C1 and the transfer of the accumulated electric charges to the C2 for generating a negative power source. The supply current control circuit 20 includes a transistor PTr4, a switching element SW4, and a transistor NTr6 which forms a current mirror with a transistor NTr5 which constitutes an output stage of the amplifier circuit 6. The C1 is charged with a supply current which is positively correlated with a load current via the NTr6, the SW4, the PTr3, and the PTr4.

11 Claims, 10 Drawing Sheets

| U.S. PATENT DOCUMENTS | | | | | FOREIGN PATENT DOCUMENTS | | |
|---|---|---|---|---|---|---|---|
| 2005/0105364 | A1* | 5/2005 | Hashimoto | 365/222 | JP | 2005-033865 | 2/2005 |
| 2006/0044052 | A1* | 3/2006 | Hashimoto | 327/536 | JP | 2005-151777 | 6/2005 |
| 2007/0008028 | A1* | 1/2007 | Kawai | 327/536 | JP | 2008125220 A | 5/2008 |
| 2008/0111530 | A1 | 5/2008 | Hasegawa et al. | | | | |
| 2008/0273120 | A1* | 11/2008 | Doy et al. | 348/707 | * cited by examiner | | |

US 8,395,437 B2

CHARGE PUMP CIRCUIT AND SEMICONDUCTOR INTEGRATED CIRCUIT

TECHNICAL FIELD

The present invention relates to a charge pump circuit which supplies a power source to a driven circuit, and more particularly, to a charge pump circuit and a semiconductor integrated circuit which are preferably used for reducing noise generated when electric charges are accumulated in a capacitor.

BACKGROUND ART

Up to now, as a circuit which is driven by a single power source, that is, one positive power source and outputs a signal to a small resistor terminated at the ground, Patent document 1 discloses a technology for a charge pump circuit which drives a video amplifier as illustrated in FIG. 13. In this conventional technology, the charge pump circuit generates a negative power source (VEE) based on a positive power source (VCC) and a ground voltage (GND), and a driven circuit which is driven between the positive power source (VCC) and the negative power source (VEE) directly drives a load without using a capacitor for cutting a DC (direct current) with the ground voltage (GND) being as a central level, whereby a signal is outputted.

In the charge pump circuit used in this technology, during a first period of a clock signal, a capacitor is directly connected between a supplied positive voltage and the ground voltage to accumulate electric charges, and during a second period of the clock signal, the capacitor is directly connected between the ground voltage and a negative voltage terminal which generates a negative voltage to transfer the accumulated electric charges. This series of operations is repeatedly performed, to thereby generate the negative voltage.

In such a charge pump circuit, during the period during which the electric charges are accumulated in the capacitor, a current amount is large during the earlier half of the period, gradually decreases with time, and becomes smaller during the latter half of the period. When the amount of the current consumed by the video amplifier and the load thereof is large, the large current flowing during the earlier half of the period causes problems such as power source noise and consumption beyond the current supply capability.

As a technology for solving these problems, Patent document 2 discloses a technology for a charge pump circuit which drives a video amplifier as illustrated in FIG. 14. According to this technology, the current amount during the period during which the electric charges are accumulated in the capacitor of the charge pump circuit is set to be constant. In this technology, a constant current is generated by using an internal constant current circuit irrespective of the amount of the current consumed by the video amplifier, and this constant current is used for accumulating the electric charges in the capacitor. Therefore, the equivalent amounts of currents flow between the earlier half and the latter half of the period during which the electric charges are accumulated, and hence it is possible to prevent the large current from flowing only during the earlier half of the period.

CITATION LIST

Patent Document

Patent Document 1
JP 2001-309400 A
Patent Document 2
JP 2005-151777 A

SUMMARY OF INVENTION

Technical Problem

However, in the conventional technology of Patent document 2 described above, the current for accumulating the electric charges in the capacitor is set to be constant irrespective of the amount of the current consumed by the video amplifier. Therefore, the value of this constant current needs to be set to such a relatively large value that the charge pump circuit can operate without any problem even when the current consumed by the video amplifier is the largest. For this reason, a current larger than necessary flows within a normal use range. As a result, the power source noise becomes larger, and further, a power source having a large current supply capability is needed.

In view of the above, the present invention has been made by focusing attention on these unsolved problems of the conventional technology, and therefore has an object to provide a charge pump circuit and a semiconductor integrated circuit which are preferably used for reducing noise generated when electric charges are accumulated in a capacitor of the charge pump circuit, the charge pump circuit generating a power source and driving a driven circuit with the generated power source.

Solution to Problem (Invention 1) In order to achieve the object described above, a charge pump circuit of Invention 1 alternately repeats a first state in which electric charges from an input power source are accumulated in a capacitor and a second state in which the electric charges accumulated in the capacitor are transferred to a power source supply part, to thereby generate an output power source having a predetermined polarity, and includes supply current amount control means for controlling a supply amount of a current when the electric charges are accumulated in the capacitor, on the basis of an amount of a current flowing through a driven circuit which is driven by the output power source.

With the configuration as described above, the supply current amount control means can perform a control for increasing or decreasing the amount of the current supplied (hereinafter, referred to as supply current amount) to the capacitor, for example, so as to follow an increase or decrease of the amount of the current (hereinafter, referred to as current amount) flowing through the driven circuit.

As a result, it is possible to reduce a difference between the current amount consumed by the driven circuit and the supply current amount when the electric charges are accumulated in (hereinafter, referred to as charging) the capacitor. Accordingly, there are obtained effects that an excessive current can be prevented from being supplied to the driven circuit and noise generated when the capacitor is charged can be reduced.

Here, the above-mentioned current flowing through the driven circuit corresponds to a current flowing through the entire driven circuit, a current flowing through a part (an output part to another circuit, the vicinity of a load, or the like) of the driven circuit, or the like.

(Invention 2) Further, according to a charge pump circuit of Invention 2, in the charge pump circuit of Invention 1, the supply current amount control means controls the amount of the current supplied to the capacitor so that a positive correlation is established between the amount of the current supplied to the capacitor and the amount of the current flowing through the driven circuit.

With the configuration as described above, the operation and effect equivalent to those of Invention 1 can be obtained.

(Invention 3) Further, according to a charge pump circuit of Invention 3, in the charge pump circuit of Invention 1 or 2, the supply current amount control means controls the amount of the current supplied to the capacitor so that the amount of the current supplied to the capacitor is larger by a preset amount than the amount of the current flowing through the driven circuit.

With the configuration as described above, the supply current amount can have a sufficient allowance, and hence there is obtained an effect that, even when the current amount flowing through the load (driven circuit) is 0 or when the current amount flowing through the load fluctuates to hinder the supply current amount from following the fluctuations, the charge pump circuit can be normally operated.

(Invention 4) Further, according to a charge pump circuit of Invention 4, the charge pump circuit of any one of Inventions 1 to 3 further includes: voltage detection means for detecting a voltage between both ends of the capacitor; voltage level comparison means for comparing a level of the voltage detected by the voltage detection means with a predetermined level; and switching control means for switching, when the level of the detected voltage reaches the predetermined level in the first state according to a result of the comparison by the voltage level comparison means, the first state to the second state.

With the configuration as described above, the capacitor is charged until the level of the voltage between both the ends of the capacitor reaches the predetermined level. When the level of the voltage therebetween reaches the predetermined level, the charging of the capacitor can be stopped to perform the transfer of the charged electric charges.

As a result, there is obtained an effect that the output power source having a desired voltage can be generated by setting the predetermined level to a desired voltage level.

(Invention 5) Further, according to a charge pump circuit of Invention 5, in the charge pump circuit of any one of Inventions 1 to 4, the supply current amount control means controls, when a plurality of the driven circuits are driven, the supply amount of the current when the electric charges are accumulated in the capacitor, on the basis of a sum of amounts of currents flowing through the plurality of the driven circuits.

With the configuration as described above, the supply current amount control means can perform a control for increasing or decreasing the supply current amount to the capacitor, for example, so as to follow an increase or decrease of the sum of the current amounts flowing through the plurality of driven circuits.

As a result, it is possible to reduce a difference between the sum of the current amounts consumed by the plurality of driven circuits and the supply current amount when the capacitor is charged. Accordingly, there are obtained effects that an excessive current can be prevented from being supplied to the plurality of driven circuits and the noise generated when the capacitor is charged can be reduced.

(Invention 6) Further, according to a charge pump circuit of Invention 6, in the charge pump circuit of any one of Inventions 1 to 5, the supply current amount control means controls the supply amount of the current when the electric charges are accumulated in the capacitor, on the basis of an amount of a current flowing through an output part of the driven circuit.

With the configuration as described above, the supply current amount to the capacitor can be controlled on the basis of the amount of the current flowing through the output part of the driven circuit, and hence there is obtained an effect that the control of the supply current amount can be performed with a relatively simple configuration by feeding back the current flowing through the output part to the charge pump circuit.

(Invention 7) Further, according to a charge pump circuit of Invention 7, in the charge pump circuit of any one of Inventions 1 to 6, the driven circuit is an amplifier circuit.

With the configuration as described above, the driven circuit is the amplifier circuit, and hence there is obtained an effect that such a configuration can easily be realized in a semiconductor integrated circuit.

(Invention 8) Further, according to a charge pump circuit of Invention 8, in the charge pump circuit of any one of Inventions 1 to 7, the supply current amount control means includes a current generation part for generating a second current proportional to a first current which is an output current of an output stage of the amplifier circuit, the current generation part being in a current mirror relation with the first current, and the supply current amount control means controls the supply amount of the current when the electric charges are accumulated in the capacitor in the first state, on the basis of the second current generated by the current generation part.

With the configuration as described above, the supply current amount to the capacitor can be controlled on the basis of the current amount of the second current proportional to the first current flowing from the amplifier circuit to the load.

Accordingly, it is possible to easily perform a control for increasing or decreasing the supply current amount to the capacitor so as to follow an increase or decrease of the current amount of the first current.

As a result, it is possible to reduce a difference between the current amount consumed by the load on the driven circuit and the supply current amount to the capacitor. Accordingly, there are obtained effects that an excessive current can be prevented from being supplied to the driven circuit and the noise generated when the capacitor is charged can be reduced.

(Invention 9) Further, according to a charge pump circuit of Invention 9, the charge pump circuit of any one of Inventions 1 to 8 generates, based on the input power source, the output power source having a polarity opposite to a polarity of the input power source. In the charge pump circuit of any one of Inventions 1 to 8, the power source supply part is configured to supply, to the driven circuit, a power source within a voltage range between the output power source and a power source having a polarity opposite to the polarity of the output power source.

With the configuration as described above, the power source supply part can supply, to the driven circuit, a power source of a positive voltage having the same polarity as that of the input power source and a power source of a negative voltage generated by the charge pump circuit, for example, with the ground voltage being used as a reference.

As a result, there is obtained an effect that it is possible to drive the driven circuit which is driven by using both of the positive power source and the negative power source with the ground voltage being used as the reference.

(Invention 10) On the other hand, in order to achieve the object described above, a semiconductor integrated circuit of Invention 10 is formed by integrating a circuit including the charge pump circuit according to any one of Inventions 1 to 9 on a semiconductor substrate.

With the configuration as described above, it is possible to obtain a semiconductor integrated circuit which can bring about the operation and effect equivalent to those of the charge pump circuit according to any one of Inventions 1 to 9.

DESCRIPTION OF EMBODIMENTS

First Embodiment

Hereinafter, a first embodiment of the present invention is described with reference to the drawings. FIG. 1 to FIG. 6 are diagrams illustrating a charge pump circuit and a semiconductor integrated circuit according to the first embodiment of the present invention.

This embodiment describes a system configuration in which the charge pump circuit according to the present invention is applied to an amplifier circuit which is a driven circuit, and an input signal is amplified by this amplifier circuit to be supplied to a load.

Figure 1:
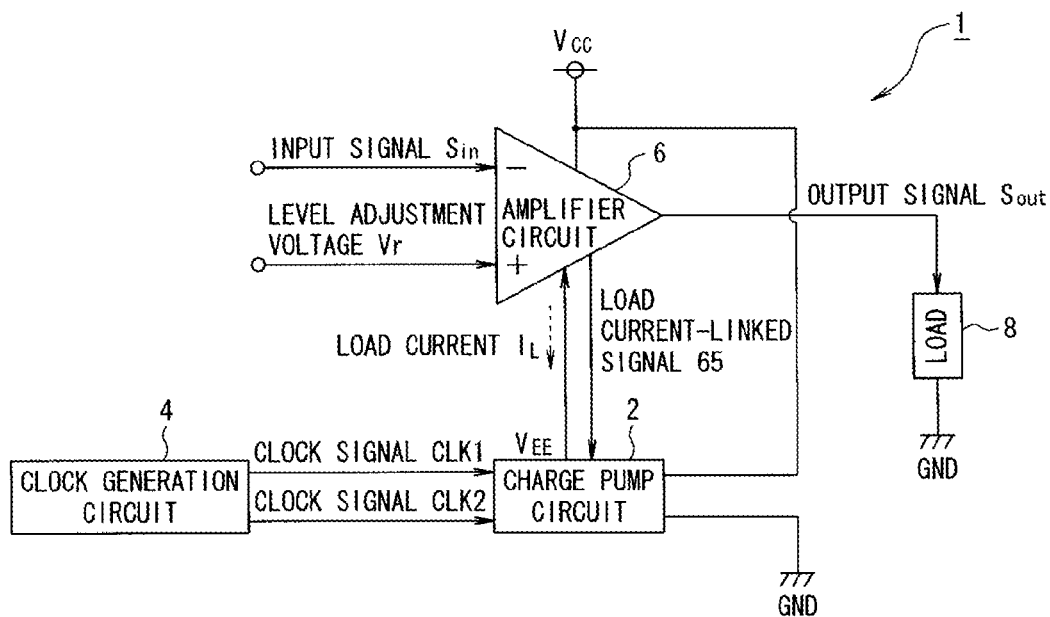
FIG. 1 is a block diagram illustrating a configuration of a load driving system 1.

First, with reference to FIG. 1, the configuration of a load driving system 1 according to the present invention is described. FIG. 1 is a block diagram illustrating the configuration of the load driving system 1 according to the first embodiment of the present invention.

As illustrated in FIG. 1, the load driving system 1 includes a charge pump circuit 2, a clock generation circuit 4, an amplifier circuit 6, and a load 8.

The charge pump circuit 2 has a function of generating a negative output power source $V_{EE}$ based on a positive input power source $V_{CC}$ with the use of a charge pump method using a capacitor and a switching element. The generated negative output power source $V_{EE}$ is supplied to the amplifier circuit 6.

The clock generation circuit 4 includes an oscillator such as a crystal oscillator or a ceramic oscillator, and has a function of generating two types of clock signals CLK1 and CLK2 (hereinafter, simply referred to as CLK1 and CLK2) for controlling the on/off of the switching element included in the charge pump circuit 2. It should be noted that the CLK1 and the CLK2 are signals having the same cycle and the same amplitude, and the phase of one of the signals is shifted by a half cycle with respect to that of another one of the signals. Specifically, when the clock signal CLK1 is at a high level, the clock signal CLK2 becomes a low level. When the clock signal CLK1 is at a low level, the clock signal CLK2 becomes a high level. In addition, the generated clock signals CLK1 and CLK2 are supplied to the charge pump circuit 2.

The amplifier circuit 6 is an inverting amplifier circuit including an operational amplifier, and has a function of outputting an output signal $S_{out}$ which is obtained by inverting and amplifying a differential signal between an input signal $S_{in}$ inputted to an inverting input terminal (−) thereof and a level adjustment voltage Vr for an offset voltage which is inputted to a non-inverting input terminal (+) thereof.

The load 8 is a load driven by the output signal $S_{out}$ from the amplifier circuit 6, and, for example, when the input signal $S_{in}$ is a speech input signal, a speaker, headphones, or the like corresponds to the load 8. In addition, a buffer circuit that drives the speaker or the headphones at the subsequent stage also corresponds to the load 8.

Figure 2:
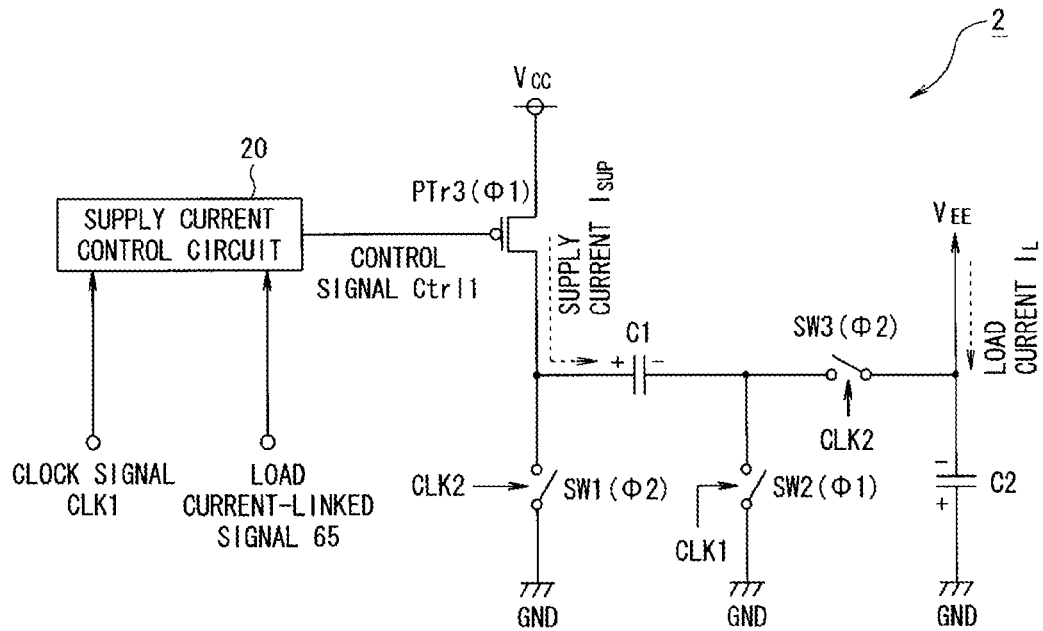
FIG. 2 is a circuit diagram illustrating a detailed configuration of a charge pump circuit 2.

Next, with reference to FIG. 2, the detailed configuration of the charge pump circuit 2 is described.

Here, FIG. 2 is a circuit diagram illustrating the detailed configuration of the charge pump circuit 2.

As illustrated in FIG. 2, the charge pump circuit 2 of this embodiment includes a transistor PTr3 which is a P-channel MOS transistor, capacitors C1 and C2, switching elements SW1, SW2, and SW3, and a supply current control circuit 20.

In this embodiment, the switching elements SW1, SW2, and SW3 are each formed of an N-channel MOS transistor. It should be noted that the switching elements SW1, SW2, and SW3 are not limitatively formed of an N-channel MOS transistor, but can also be formed of a P-channel MOS transistor.

A control signal output terminal (not shown) of the supply current control circuit 20 is electrically connected to a gate terminal of the PTr3, and a source terminal of the PTr3 is electrically connected to an input terminal of the charge pump circuit 2 for the power source $V_{CC}$. It should be noted that this input terminal is electrically connected to a power supply terminal of the power source for the positive voltage $V_{CC}$.

A drain terminal of the PTr3 is electrically connected to each of a positive-side terminal of the C1 and a drain terminal of the SW1, and a source terminal of the SW1 is electrically connected to a ground terminal (GND) of the charge pump circuit 2. It should be noted that this ground terminal is connected to a ground potential (0[V]).

Further, though not illustrated, a gate terminal of the SW1 is electrically connected to an output terminal of the clock generation circuit 4 for the CLK2.

A negative-side terminal of the C1 is electrically connected to each of drain terminals of the SW2 and the SW3. A source terminal of the SW2 is electrically connected to the ground terminal. A source terminal of the SW3 is electrically connected to a negative-side terminal of the C2.

Further, though not illustrated, a gate terminal of the SW2 is electrically connected to an output terminal of the clock generation circuit 4 for the clock signal CLK1, and a gate terminal of the SW3 is electrically connected to the output terminal of the clock generation circuit 4 for the CLK2.

Figure 3:
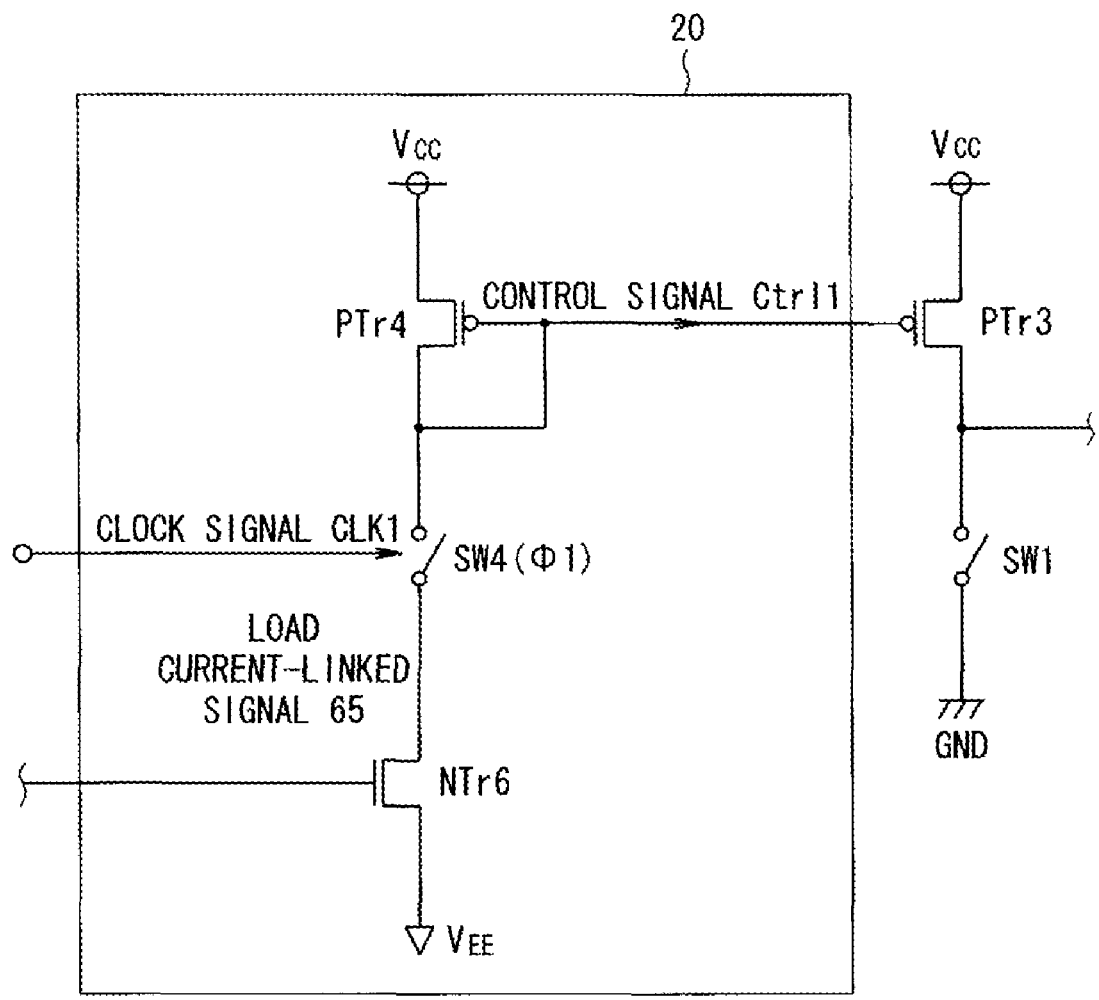
FIG. 3 is a circuit diagram illustrating a detailed configuration of a supply current control circuit 20.

Next, with reference to FIG. 3, the detailed configuration of the supply current control circuit 20 is described.

Here, FIG. 3 is a circuit diagram illustrating the detailed configuration of the supply current control circuit 20.

As illustrated in FIG. 3, the supply current control circuit 20 of this embodiment includes a transistor PTr4 which is a P-channel MOS transistor, a switching element SW4, and a transistor NTr6 which is an N-channel MOS transistor.

In this embodiment, the switching element SW4 is formed of an N-channel MOS transistor. It should be noted that the switching element SW4 is not limitatively formed of an N-channel MOS transistor, but can also be formed of a P-channel MOS transistor.

A source terminal of the PTr4 is electrically connected to an input terminal of the supply current control circuit 20 for the power source $V_{CC}$, and a drain terminal of the PTr4 is electrically connected to a drain terminal of the SW4. It should be noted that this input terminal is electrically connected to the power supply terminal of the power source $V_{CC}$.

A gate terminal of the PTr4 is electrically connected to each of the drain terminal of the PTr4 and the gate terminal of the PTr3, and the PTr3 and the PTr4 form a current mirror circuit.

A source terminal of the SW4 is electrically connected to a drain terminal of the NTr6, and a gate terminal of the SW4 is electrically connected to the output terminal of the clock oscillation circuit 4 for the CLK1.

A source terminal of the NTr6 is electrically connected to the negative voltage $V_{EE}$ which is the output power source, and a gate terminal of the NTr6 is electrically connected to a gate terminal of a transistor NTr5 (described later) which is an N-channel MOS transistor and is included in the amplifier circuit 6.

Further, when the NTr6 and the SW4 are turned on, a load current-linked signal 65, which is a current signal flowing between the drain and the source of the NTr6, is supplied to the gate terminal and the drain terminal of the PTr4 and the gate terminal of the PTr3 via the SW4.

With the configuration described above, in the charge pump circuit 2, the SW2 and the SW4 are turned on when the CLK1 from the clock generation circuit 4 is at a high level, and are turned off when the CLK1 is at a low level. In addition, the SW1 and the SW3 are turned on when the clock signal CLK2 is at a high level, and are turned off when the clock signal CLK2 is at a low level. It should be noted that the SW2 and the SW3 turn on/off the path in a negative voltage region, and thus are appropriately level-shifted in use.

Further, when the SW2 and the SW4 are turned on and the SW1 and the SW3 are turned off, and when a control signal Ctrl1 becomes a driving potential of the PTr3 (a potential at which the PTr3 is turned on), the PTr3 is turned on. As a result, a supply current $I_{SUP}$ from the power source $V_{CC}$ is supplied to the C1, and the C1 is charged during this first period (Φ1).

In addition, when the SW2 and the SW4 are turned off and the SW1 and the SW3 are turned on, the PTr3 is turned off. As a result, the supply current from the power source $V_{CC}$ stops being supplied to the C1, and the C1 is not charged during this second period (Φ2).

Meanwhile, when the SW2 and the SW4 are turned off and the SW1 and the SW3 are turned on, a closed loop of GND-SW1-C1-SW3-C2-GND is formed, and the electric charges accumulated in the C1 are transferred to the C2 with the polarities illustrated in FIG. 2.

The switching between the on/off of the SW2 and the SW4 and the on/off of the SW1 and the SW3 is repeatedly (continuously) performed at a switching timing based on the CLK1 and the CLK2 described above, whereby the negative voltage $V_{EE}$ having substantially the same level as that of a voltage obtained by inverting the polarity of the positive voltage $V_{CC}$ can be generated between the ground terminal and a supply terminal of the output power source.

In addition, a potential of the control signal Ctrl1 changes in accordance with a current level of the load current-linked signal 65. As the current level of the load current-linked signal 65 is larger, the potential of the control signal Ctrl1 becomes lower. Accordingly, as the current level of the load current-linked signal 65 is larger, a voltage $V_{GS}$ applied between the gate and the source of the PTr3 becomes larger in a negative direction, which increases the supply current $I_{SUP}$.

Specifically, a positive correlation is established between the load current-linked signal 65 and the supply current $I_{SUP}$, and hence the supply current amount to the capacitor C1 increases or decreases in accordance with the increase or decrease of the current level of the load current-linked signal 65.

Figure 4:
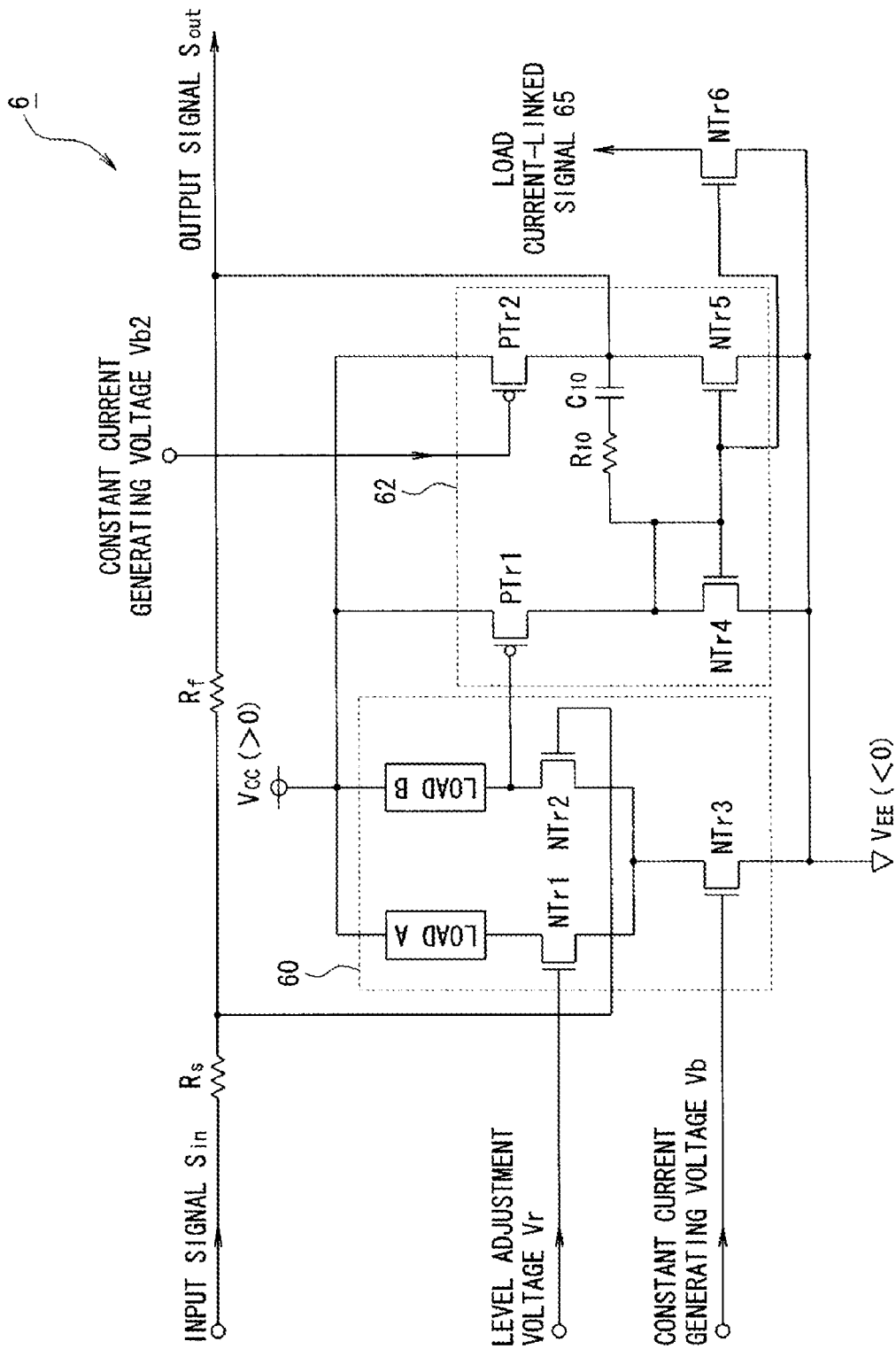
FIG. 4 is a circuit diagram illustrating a detailed configuration of an amplifier circuit 6.

Next, with reference to FIG. 4, the detailed configuration of the amplifier circuit 6 is described.

Here, FIG. 4 is a circuit diagram illustrating the detailed configuration of the amplifier circuit 6.

As illustrated in FIG. 4, the amplifier circuit 6 includes an input stage differential circuit 60, an output stage circuit 62, and resistors $R_s$ and $R_f$.

The input stage differential circuit 60 includes a load A, a load B, and transistors NTr1, NTr2, and NTr3 which are N-channel MOS transistors.

The output stage circuit 62 includes transistors PTr1 and PTr2 which are P-channel MOS transistors, transistors NTr4 and NTr5 which are N-channel MOS transistors, and a resistor $R_{10}$ and a capacitor $C_{10}$ for phase compensation.

The resistors Rs and Rf have a function of determining a voltage gain of the amplifier circuit 6 and also have a function of feeding back the output signal $S_{out}$ to a gate terminal of the NTr2, which is the inverting input terminal (−).

Specifically, the amplifier circuit 6 is the inverting amplifier circuit including: the operational amplifier formed of a differential pair of the input stage differential circuit 60 and the output stage circuit 62; and the resistors Rs and Rf.

In this embodiment, the load A and the load B are assumed to be resistor elements $R_A$ and $R_B$, respectively. It should be noted that the load A and the load B may be formed of other elements, for example, a current mirror circuit using MOS transistors.

In addition, the positive power source of the positive voltage $V_{CC}$ and the negative power source of the negative voltage $V_{EE}$ are supplied from the charge pump circuit 2 to a positive power source input terminal and a negative power source input terminal of the amplifier circuit 6, respectively.

Each of one ends of the $R_A$ and the $R_B$, which constitute the input stage differential circuit 60, is electrically connected to the positive power source input terminal for the power source $V_{CC}$, another end of the $R_A$ is electrically connected to a drain terminal of the NTr1, and another end of the $R_B$ is electrically connected to a drain terminal of the NTr2.

Further, each of source terminals of the NTr1 and the NTr2 is electrically connected to a drain terminal of the NTr3, and a source terminal of the NTr3 is electrically connected to the negative power source input terminal for the power source $V_{EE}$.

Further, the gate terminal of the NTr2 serves as the input terminal for the input signal $S_{in}$, and thus receives the input signal $S_{in}$ from an external device (not shown).

Further, the level adjustment voltage Vr is applied to a gate terminal of the NTr1, and a constant current generating voltage Vb which is high enough to drive the NTr3 in a saturation region is applied to a gate terminal of the NTr3.

Each of source terminals of the PTr1 and the PTr2, which constitute the output stage circuit 62, is electrically connected to the positive power source input terminal, a gate terminal of the PTr1 is electrically connected to the drain terminal of the NTr2, and a constant current generating voltage Vb2 which is high enough to drive the PTr2 in the saturation region is applied to a gate terminal of the PTr2.

Further, a drain terminal of the PTr1 is electrically connected to a drain terminal of the NTr4, a drain terminal of the PTr2 is electrically connected to a drain terminal of the NTr5, and each of source terminals of the NTr4 and the NTr5 is electrically connected to the negative power source input terminal.

Further, a gate terminal of the NTr5 is electrically connected to one end of the resistor $R_{10}$, another end of the $R_{10}$ is electrically connected to one end of the capacitor $C_{10}$, and another end of the $C_{10}$ is electrically connected to each of the drain terminal of the NTr5 and a signal output terminal of the amplifier circuit 6. In addition, the signal output terminal is electrically connected to the load 8.

Further, a gate terminal of the NTr4 and the gate terminal of the NTr5 are electrically connected to each other, and the gate terminal and the drain terminal of the NTr4 are electrically connected to each other. With this configuration, the NTr4 and the NTr5 form a current mirror circuit.

In addition, each of the gate terminals of the NTr4 and the NTr5 is electrically connected to a gate terminal of the NTr6, and a current mirror relation is established between a first current flowing between the drain and the source of the NTr5 and a second current flowing between a drain and a source of the NTr6. It should be noted that the first current is a current $I_L$ flowing through the load 8, the second current is a current proportional to the load current $I_L$, and a signal of this second current is the load current-linked signal 65. Specifically, the load current-linked signal 65 is determined by a ratio of the size (ratio of the channel width and channel length) between the NTr5 and the NTr6. When both of the transistors have the same size, the load current-linked signal 65 becomes a current signal having substantially the same level as that of the load current $I_L$.

In addition, one end of the resistor Rs is electrically connected to a signal input terminal of the amplifier circuit 6, another end of the resistor Rs is electrically connected to each of one end of the resistor Rf and the gate terminal of the NTr2, and another end of the Rf is electrically connected to the signal output terminal.

The amplifier circuit 6 having the configuration described above is driven by the negative power source of the negative voltage $V_{EE}$, which is generated and also supplied by the charge pump circuit 2, and the positive power source of the positive voltage $V_{CC}$, and inverts and amplifies the input signal $S_{in}$ based on the amplification degree determined by the resistors Rs and Rf with respect to the level adjustment voltage Vr as the center, to output the inverted and amplified signal as the output signal $S_{out}$ with the ground voltage (0[V]) being as the central level.

In addition, a final output stage of the output stage circuit 62 is formed of the complementary transistors PTr2 and NTr5, which are controlled by signals supplied from the Vb2 and the NTr4, respectively.

With this configuration, the output signal $S_{out}$ is outputted so as to have a voltage range above and below the ground voltage.

In this embodiment, of the charge pump circuit 2 and the amplifier circuit 6 described above, at least the charge pump circuit 2 is formed as a semiconductor integrated circuit which is manufactured by integrating MOS transistors on a semiconductor substrate.

Figure 5:
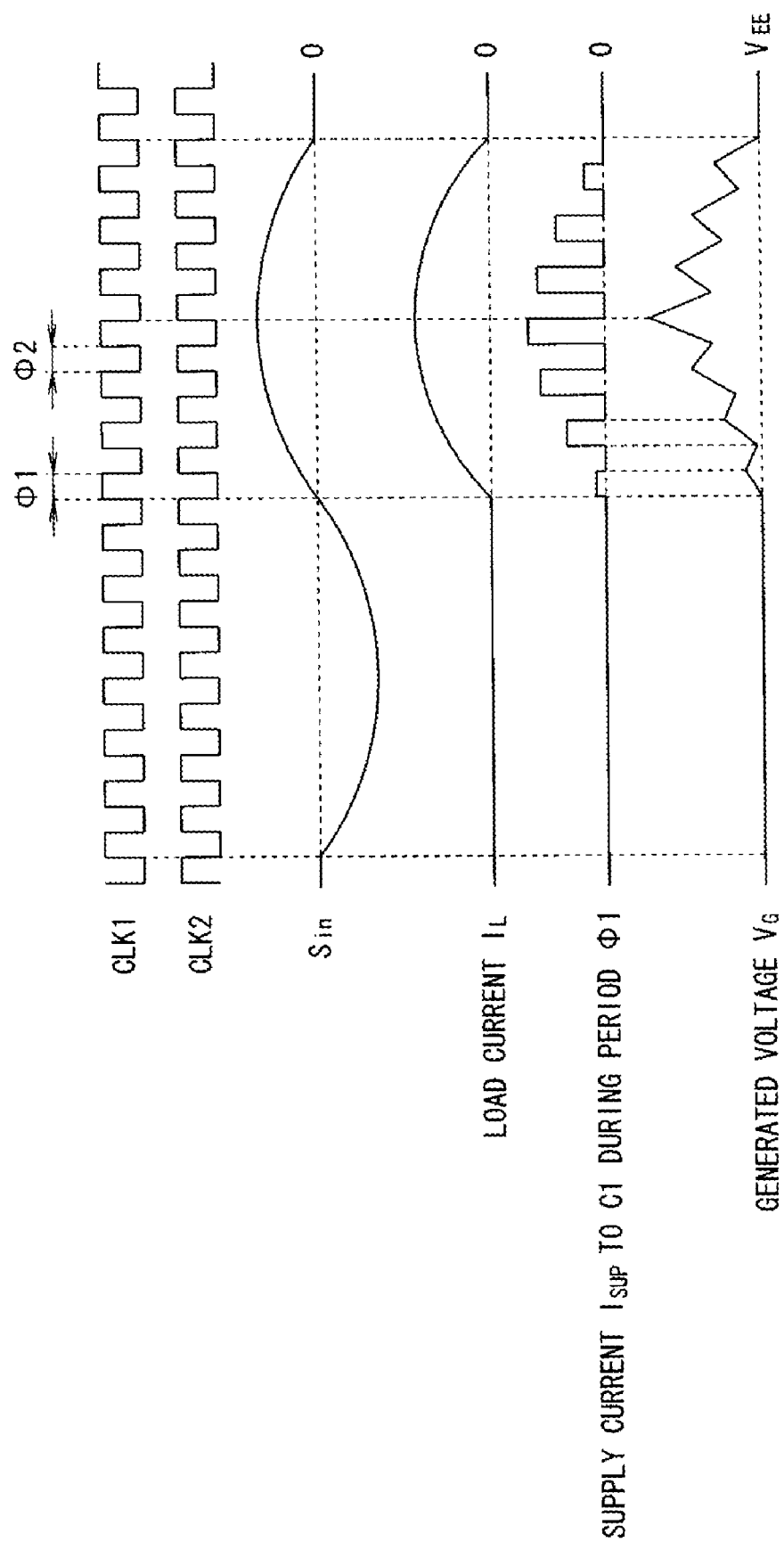
FIG. 5 is a timing chart of signals flowing through the charge pump circuit 2, a clock generation circuit 4, and the amplifier circuit 6.

Next, with reference to FIG. 5, a more detailed operation of the load driving system 1 of this embodiment is described.

Here, FIG. 5 is a timing chart of signals flowing through the charge pump circuit 2, the clock generation circuit 4, and the amplifier circuit 6.

In FIG. 5, the clock signals CLK1 and CLK2 and the input signal $S_{in}$ are each shown as a voltage waveform, and the load current $I_L$ which flows into the supply terminal of the power source for the negative voltage $V_{EE}$ is shown as a waveform of an absolute value of the current. In addition, a generated voltage $V_G$ is a voltage which is generated when the negative voltage $V_{EE}$ (constant voltage) is used as a reference.

When the power sources are supplied to the respective circuits in the load driving system 1, the respective circuits are activated. At timings shown in FIG. 5, the clock signal CLK1 is supplied to each of the gate terminals of the SW2 and the SW4, the clock signal CLK2 is supplied to each of the gate terminals of the SW1 and the SW3, and the input signal $S_{in}$ is inputted to the inverting input terminal (−) of the amplifier circuit 6.

As a result, when the input signal $S_{in}$ is the negative voltage, during the period (Φ1) during which the CLK1 is at a high level, the CLK2 becomes a low level, the SW2 and the SW4 of the charge pump circuit 2 are turned on, the SW1 and the SW3 thereof are turned off, and the PTr4 thereof is turned on. However, because the input signal $S_{in}$ is the negative voltage, a current is supplied from the power source for the positive voltage $V_{CC}$ to the load 8, and the load current $I_L$ is not supplied from the power source for the negative voltage $V_{EE}$ to the load 8. For this reason, the potential of the control signal Ctrl1 becomes substantially the same as that of the $V_{CC}$, so that the PTr3 is turned off. Accordingly, the supply current $I_{SUP}$ is not supplied to the C1, and hence the C1 is not charged.

Moreover, during the period (Φ2) during which the CLK2 is at a high level, the CLK1 becomes a low level, the SW2 and the SW4 of the charge pump circuit 2 are turned off, and the SW1 and the SW3 thereof are turned on. However, during the period during which the input signal $S_{in}$ is the negative voltage, because the supply current $I_{SUP}$ is not supplied to the C1 during the period Φ1, the electric charges are not transferred from the C1 to the C2. In addition, the PTr3 and the PTr4 are turned off.

From the above description, as shown in FIG. 5, during the period during which the input signal $S_{in}$ is the negative voltage, all of the load current $I_L$, the supply current $I_{SUP}$, and the generated voltage $V_G$ determined by using the voltage $V_{EE}$ as the reference are On the other hand, when the input signal $S_{in}$ is the positive voltage, during the period (Φ1) during which the CLK1 is at a high level, the CLK2 becomes a low level, the SW2 and the SW4 of the charge pump circuit 2 are turned on, and the SW1 and the SW3 thereof are turned off. When the input signal $S_{in}$ is the positive voltage, the load current $I_L$ is supplied from the power source for the negative voltage $V_{EE}$ to the load 8. At this time, the NTr6 of the supply current control circuit 20 included in the charge pump circuit 2 is also turned on.

Accordingly, the load current-linked signal 65 proportional to the load current $I_L$ flows between the drain and the source of the NTr6. In addition, during the period Φ1, the SW4 is turned on, so that the load current-linked signal 65 is supplied to each of the gate terminals of the PTr4 and the PTr3. Then, the potential of the control signal Ctrl1 becomes a potential according to the current level of the load current-linked signal 65 (low potential), and the $V_{GS}$ applied across the PTr3 becomes the driving potential thereof to thereby turn on the PTr3. As a result, as shown in FIG. 5, during the period Φ1, the supply current $I_{SUP}$ proportional to the current level of the load current $I_L$ is supplied to the C1, so that the C1 is charged.

Moreover, during the period (Φ2) during which the CLK2 is at a high level, the CLK1 becomes a low level, the SW2 and the SW4 of the charge pump circuit 2 are turned off, the SW1 and the SW3 thereof are turned on, and the PTr3 and the PTr4 thereof are turned off. As a result, the electric charges accumulated in the C1 during the period Φ1 are transferred to the C2, so that the C2 is charged. Further, the load current $I_L$ is supplied from the power source for the negative voltage $V_{EE}$ to the load 8.

From the above description, as shown in FIG. 5, during the period during which the input signal $S_{in}$ is the positive voltage, the supply current $I_{SUP}$ becomes an output value according to the level of the load current $I_L$, and the generated voltage $V_G$ becomes an output value according to the level (supply amount) of the supply current $I_{SUP}$.

Specifically, the generated voltage $V_G$ increases in the ground voltage direction due to the load current $I_L$ during the period Φ1, and decreases in the negative voltage direction during the period Φ2 because the electric charges accumulated in the capacitor C1 are transferred to the capacitor C2. At this time, the amount of the transferred electric charges is positively correlated with the amount of the electric charges (supply current $I_{SUP}$) accumulated in the capacitor C1 during the period Φ1.

In addition, the period Φ1 and the period Φ2 are alternately repeated, whereby the generated voltage $V_G$ is generated, and the negative voltage $V_{EE}$ repeats a minute increase and decrease in a voltage region in which the voltage increase and the voltage decrease are balanced. The minute increase and decrease of the negative voltage $V_{EE}$ can be absorbed by providing the charge pump circuit 2 with the capacitors C1 and C2 each having an appropriately large capacitance value (this capacitance value is determined depending on the size of a load to be driven or the like; generally, 0.01 [μF] to 100 [μF], and preferably, 1 [μF]). In this way, a voltage which is sufficiently close to a negative voltage having the same absolute value as that of the positive voltage $V_{CC}$ can be made as the negative voltage $V_{EE}$. With the use of the negative voltage $V_{EE}$ thus generated, the amplifier circuit 6 can appropriately amplify a signal in a positive voltage portion contained in the input signal $S_{in}$, and also can sufficiently drive the load 8.

Figure 6:
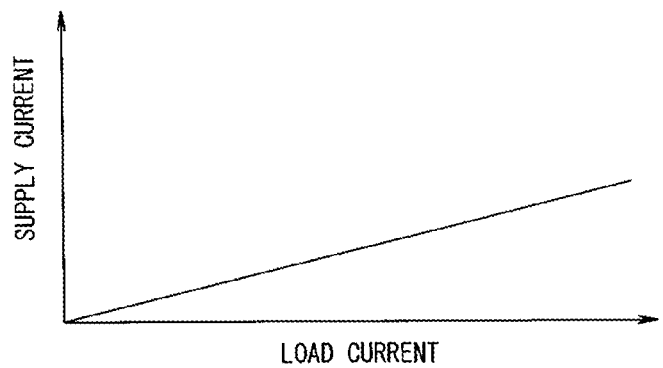
FIG. 6 is a graph showing a relation between a load current $I_L$ and a supply current $I_{SUP}$.

As described above, in the charge pump circuit 2 of this embodiment, the load current-linked signal 65 for allowing a current having the level proportional to the load current $I_L$ to flow is generated by the NTr6 which is in the current mirror relation with the NTr5 of the amplifier circuit 6, the current (supply current $I_{SUP}$) flowing between the source and the drain of the PTr3 is controlled, and the load current $I_L$ and the supply current $I_{SUP}$ are made positively correlated with each other as shown in FIG. 6. As a result, it is possible to establish a positive correlation between the load current $I_L$ and the amount of the electric charges transferred from the capacitor C1 during the period Φ2.

Here, FIG. 6 is a graph showing the relation between the load current $I_L$ and the supply current $I_{SUP}$.

With this relation shown in FIG. 6, it becomes possible to efficiently transfer the load current $I_L$ which flows into the power supply terminal for the negative voltage $V_{EE}$ and also to supply the supply current $I_{SUP}$ according to operating conditions of the amplifier circuit 6 to the capacitor C1, so that the power source noise which occurs within a normal use range can be reduced.

In the first embodiment described above, the supply current control circuit 20 corresponds to the supply current amount control means according to any one of Inventions 1, 2, 6, and 8.

Second Embodiment

Figure 7:
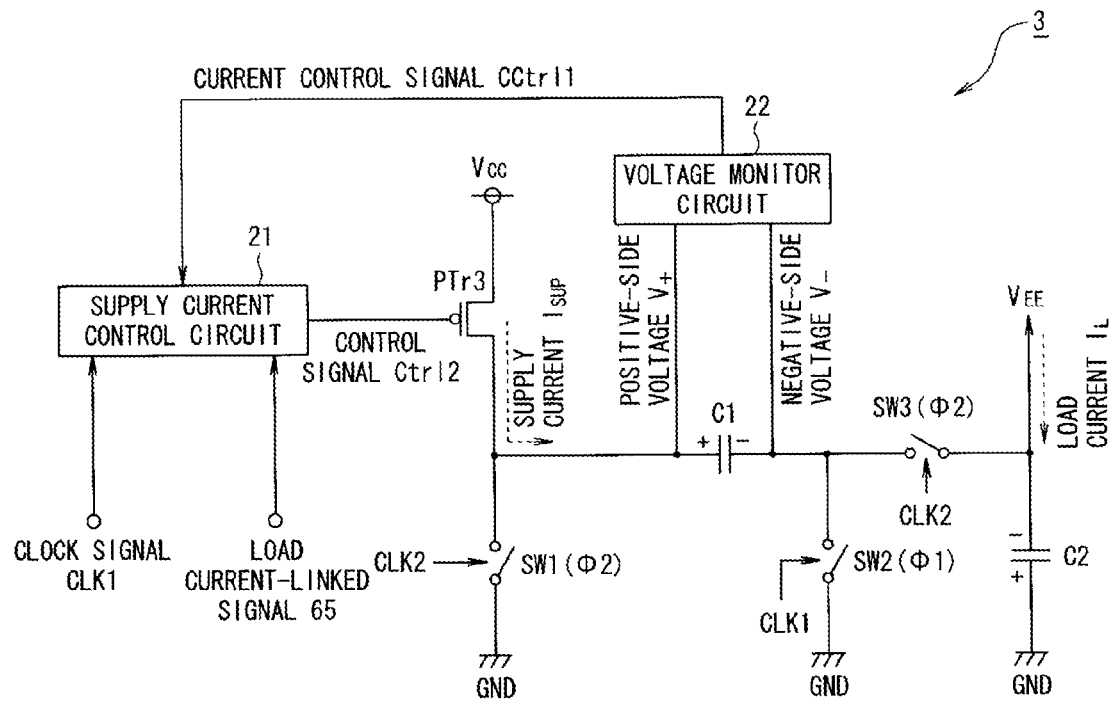
FIG. 7 is a circuit diagram illustrating a detailed configuration of a charge pump circuit 3.
Figure 8:
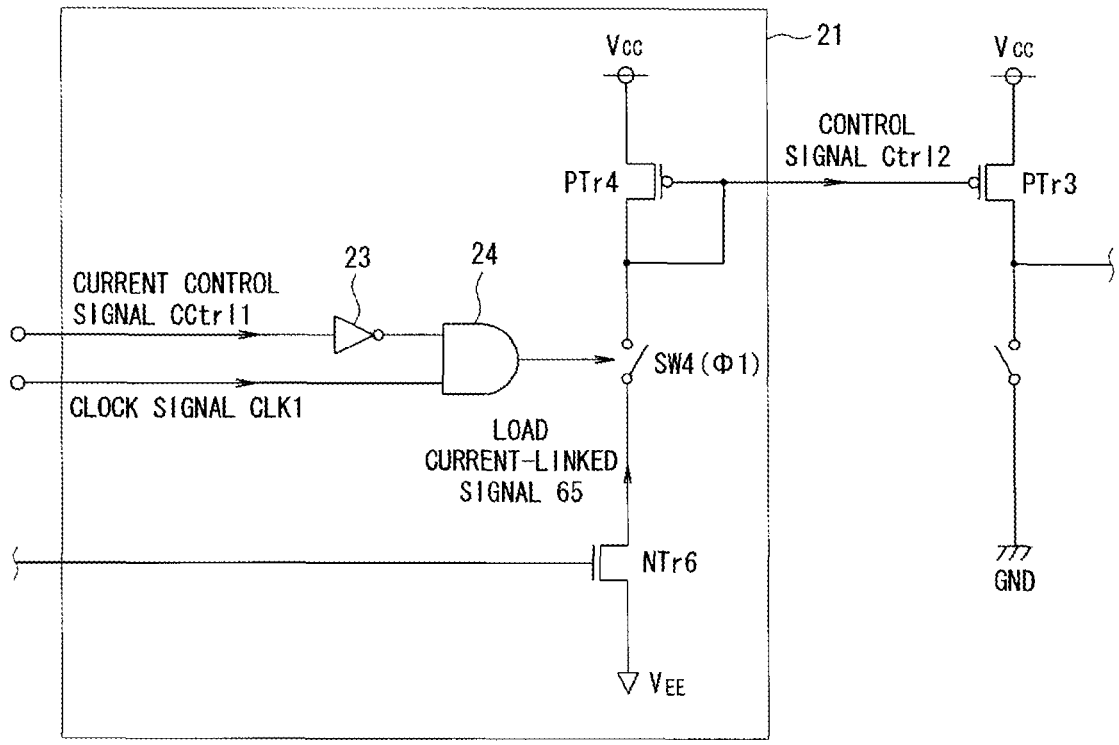
FIG. 8 is a circuit diagram illustrating a detailed configuration of a supply current control circuit 21.
Figure 9:
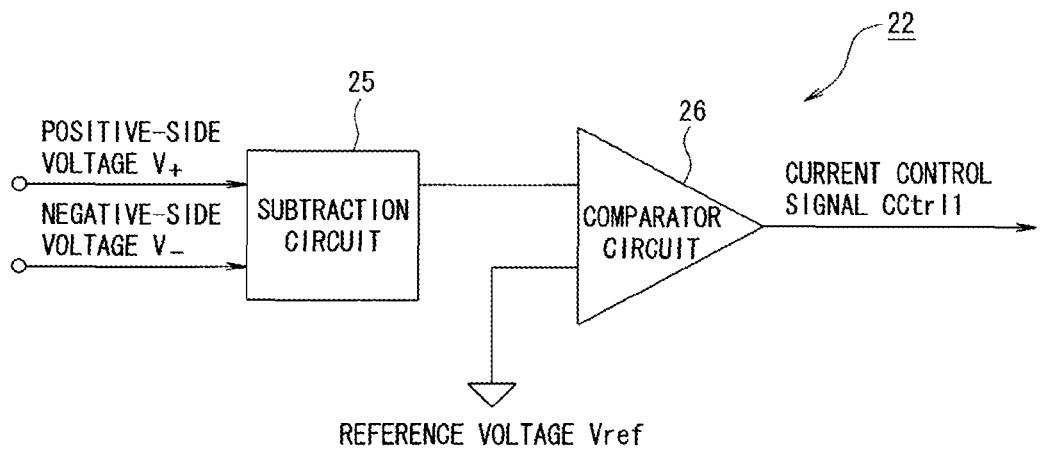
FIG. 9 is a circuit diagram illustrating a detailed configuration of a voltage monitor circuit 22.

Next, a second embodiment of the present invention is described with reference to the drawings. FIG. 7 to FIG. 9 are diagrams illustrating a charge pump circuit and a semiconductor integrated circuit according to the second embodiment of the present invention.

The charge pump circuit 2 of the first embodiment described above charges the capacitor C1 to thereby generate the negative voltage $V_{EE}$ having substantially the same absolute value as that of the positive voltage $V_{CC}$. On the other hand, a charge pump circuit 3 of this embodiment is different from the charge pump circuit 2 of the first embodiment described above in that a voltage between both ends of the capacitor C1 is monitored, and when the monitored voltage reaches a predetermined voltage, the accumulation of electric charges to the C1 can be finished.

Accordingly, components other than the charge pump circuit are the same as those in the first embodiment described above. Hereinafter, parts different from the charge pump circuit 2 of the first embodiment described above are described in detail, similar parts are denoted by the same symbols, and descriptions thereof are omitted as appropriate.

First, with reference to FIG. 7, the detailed configuration of the charge pump circuit 3 of this embodiment is described.

Here, FIG. 7 is a circuit diagram illustrating the detailed configuration of the charge pump circuit 3.

As illustrated in FIG. 7, the charge pump circuit 3 of this embodiment includes the transistor PTr3 which is a P-channel MOS transistor, the capacitors C1 and C2, the switching elements SW1, SW2, and SW3, a supply current control circuit 21, and a voltage monitor circuit 22.

A control signal output terminal (not shown) of the supply current control circuit 21 is electrically connected to the gate terminal of the PTr3, and the source terminal of the PTr3 is electrically connected to an input terminal of the charge pump circuit 3 for the power source $V_{CC}$. It should be noted that this input terminal is electrically connected to the power supply terminal of the power source for the positive voltage $V_{CC}$.

A positive voltage monitoring terminal of the voltage monitor circuit 22 is electrically connected to the positive-side terminal of the C1, a negative voltage monitoring terminal thereof is electrically connected to the negative-side terminal of the C1, and a control signal output terminal thereof is electrically connected to a control signal input terminal of the supply current control circuit 21.

The other connection configuration is the same as that in the charge pump circuit 2 of the first embodiment described above.

Next, with reference to FIG. 8, the detailed configuration of the supply current control circuit 21 is described.

Here, FIG. 8 is a circuit diagram illustrating the detailed configuration of the supply current control circuit 21.

As illustrated in FIG. 8, the supply current control circuit 21 of this embodiment includes the transistor PTr4 which is a P-channel MOS transistor, the switching element SW4, the transistor NTr6 which is an N-channel MOS transistor, a NOT circuit 23, and an AND circuit 24.

The gate terminal of the SW4 is electrically connected to an output terminal of the AND circuit 24, a first input terminal of the AND circuit 24 is electrically connected to an output terminal of the NOT circuit 23, and a second input terminal of the AND circuit 24 is electrically connected to the output terminal of the clock oscillation circuit 4 for the CLK1.

Further, the input terminal (control signal input terminal) of the NOT circuit 23 is electrically connected to the control signal output terminal of the voltage monitor circuit 22.

It should be noted that the other connection configuration is the same as that in the supply current control circuit 20 of the first embodiment described above.

Next, with reference to FIG. 9, the detailed configuration of the voltage monitor circuit 22 is described.

Here, FIG. 9 is a circuit diagram illustrating the detailed configuration of the voltage monitor circuit 22.

As illustrated in FIG. 9, the voltage monitor circuit 22 includes a subtraction circuit 25 and a comparator circuit 26.

The subtraction circuit 25 has the above-mentioned positive voltage monitoring terminal, the above-mentioned negative voltage monitoring terminal, and a subtraction result output terminal, and the subtraction result output terminal is electrically connected to a comparison voltage input terminal of the comparator circuit 26.

Further, the subtraction circuit 25 subtracts a negative-side voltage $V_-$ inputted to the negative voltage monitoring terminal from a positive-side voltage $V_+$ inputted to the positive voltage monitoring terminal, and outputs a voltage $V_d$ according to the subtraction result from the subtraction result output terminal.

The comparator circuit 26 has the comparison voltage input terminal, a reference voltage input terminal, and the above-mentioned control signal output terminal, and compares the voltage $V_d$ inputted to the comparison voltage input terminal with a reference voltage Vref (Vref<$V_{CC}$) inputted to the reference voltage input terminal. When the $V_d$ is smaller than the Vref, the comparator circuit 26 outputs a current control signal CCtr11 at a low level from the control signal output terminal. When the $V_d$ is equal to or larger than the Vref, the comparator circuit 26 outputs the current control signal CCtr11 at a high level from the control signal output terminal.

With the configuration described above, in the charge pump circuit 3, the SW2 and the SW4 are turned on when the CLK1 from the clock generation circuit 4 is at a high level and the current control signal CCtr11 is at a low level, and are turned off when the CLK1 is at a low level or the CCtr11 is at a high level.

Specifically, when the voltage $V_d$ between both the ends of the C1 is smaller than the reference voltage Vref, the current control signal CCtr11 becomes a low level, the CCtr11 which is inverted to a high level by the NOT circuit 23 is inputted to the first input terminal of the AND circuit 24, and the output of the AND circuit 24 becomes a high level when the CLK1 is at a high level.

On the other hand, when the voltage $V_d$ between both the ends of the C1 is equal to or larger than the reference voltage Vref, the current control signal CCtr11 becomes a high level, the CCtr11 which is inverted to a low level by the NOT circuit 23 is inputted to the first input terminal of the AND circuit 24, and the output of the AND circuit 24 becomes a low level whether the CLK1 is at a high level or at a low level.

Here, when the CLK1 is at a high level and the CCtr11 becomes a low level to turn on the SW2 and the SW4 and the CLK2 becomes a low level to turn off the SW1 and the SW3, the PTr3 is turned on. As a result, the supply current $I_{SUP}$ which is positively correlated with the load current $I_L$ from the power source $V_{CC}$ is supplied to the C1, and the charging of the C1 is started.

On the other hand, during the charging of the C1 (during the period Φ1 during which the CLK1 is at a high level), when the CCtr11 becomes a high level, the SW4 is turned off, and the PTr3 and the PTr4 are also turned off, so that the charging of the C1 is forcibly finished. As a result, the voltage between both the ends of the C1 can be made substantially equal to the Vref.

Moreover, when the CLK1 becomes a low level to turn off the SW2 and the SW4 and the CLK2 becomes a high level to turn on the SW1 and the SW3, a loop of GND-SW1-C1-SW3-C2-GND is formed, and the electric charges accumulated in the C1 are transferred to the C2 with the polarities illustrated in FIG. 7. As a result, the level of the negative voltage $V_{EE}$ at the supply terminal can be made equal to the level of the Vref.

It should be noted that the other operation is the same as that in the charge pump circuit 2 of the first embodiment described above.

As described above, in the load driving system 1 of this embodiment, by means of the supply current control circuit 21, the C1 of the charge pump circuit 3 can be charged with the supply current $I_{SUP}$ which is positively correlated with the load current $I_L$ flowing through the amplifier circuit 6.

Further, by means of the voltage monitor circuit 22, the voltage between both the ends of the C1 is monitored. When the voltage between both the ends thereof is equal to or larger than the Vref, by means of the supply current control circuit 21, the SW4 is turned off, so that the charging of the C1 can be finished at the Vref which is smaller than the $V_{CC}$.

Specifically, the Vref is set to a desired voltage, whereby the $V_{EE}$ can be set to a desired voltage which is smaller than the $V_{CC}$.

In a case where the configuration as described above is adopted by using the conventional charge pump circuit, because the accumulation of electric charges is finished before the capacitor C1 is sufficiently charged, the supply current becomes extremely large. On the other hand, with the charge pump circuit 3 of this embodiment, it becomes possible to supply the supply current $I_{SUP}$ according to operating conditions of the amplifier circuit 6 to the capacitor C1. Even when the charge pump circuit 3 is used so that the charging of the C1 is finished at the level of the Vref, the power source noise which occurs at this time can be reduced.

In the second embodiment described above, the supply current control circuit 21 corresponds to the supply current amount control means according to any one of Inventions 1, 2, 6, and 8, the voltage monitor circuit 22 corresponds to the voltage level comparison means according to Invention 4, and the processing of switching the SW4 based on the current control signal CCtr11 from the voltage monitor circuit 22 in the supply current control circuit 21 corresponds to the switching control means according to Invention 4.

Third Embodiment

Figure 10:
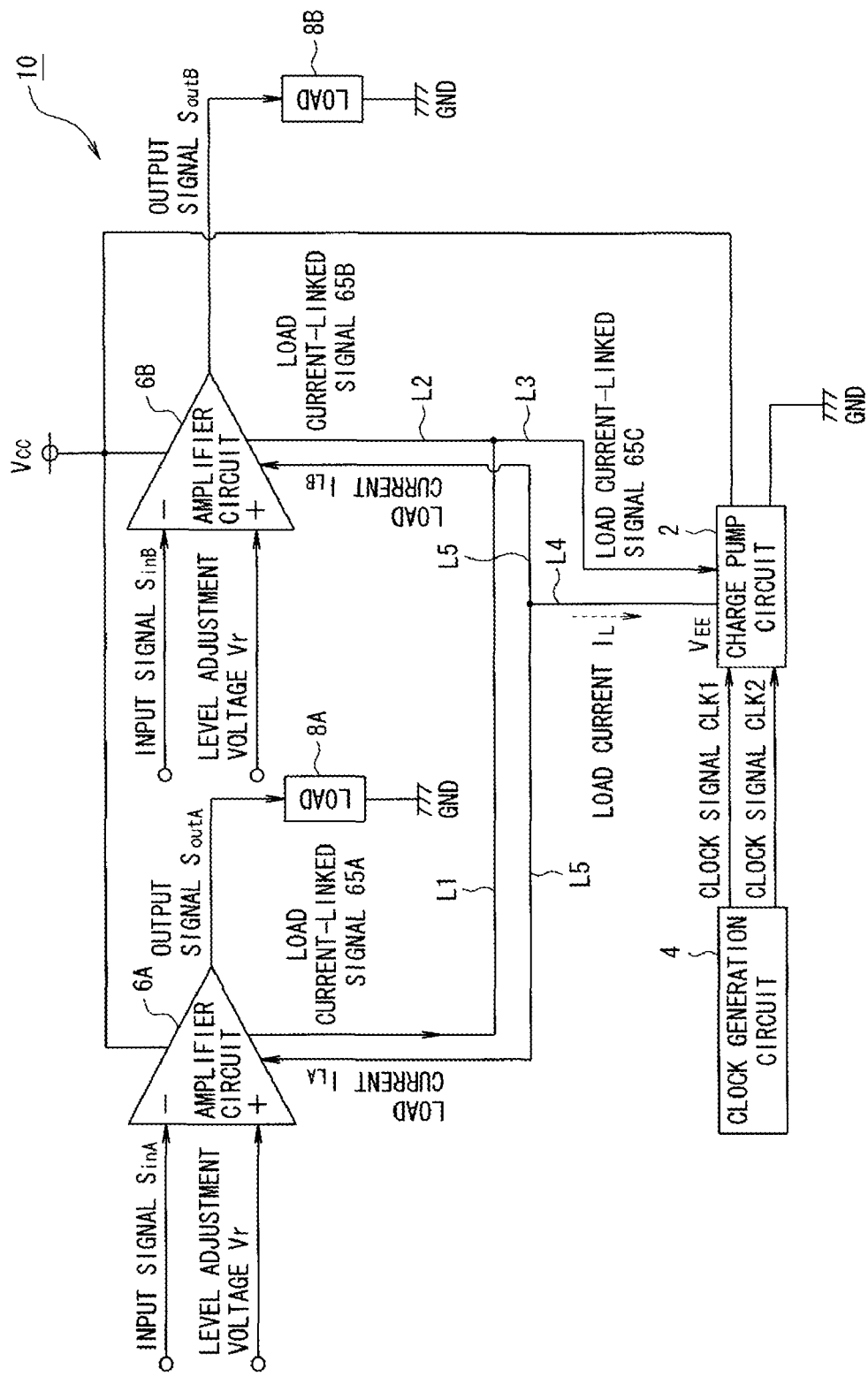
FIG. 10 is a block diagram illustrating a configuration of a load driving system 10.

Next, a third embodiment of the present invention is described with reference to the drawings. FIG. 10 is a diagram illustrating a charge pump circuit and a semiconductor integrated circuit according to the third embodiment of the present invention.

The load driving system 1 of the first embodiment described above has the configuration in which the single amplifier circuit 6 is driven as the driven circuit of the charge pump circuit 2. A load driving system 10 of this embodiment is different from the first embodiment described above in that two amplifier circuits 6A and 6B are driven as the driven circuits of the charge pump circuit 2.

Further, the load driving system 10 of this embodiment is different from the first embodiment described above in that, when the charging of the capacitor C1 is performed, the C1 is charged with the supply current $I_{SUP}$ which is positively correlated with (proportional to) a load current-linked signal 65C which is the sum of a load current-linked signal 65A and a load current-linked signal 65B. The load current-linked signal 65A is positively correlated with a load current $I_{LA}$ flowing through the amplifier circuit 6A, and the load current-linked signal 65B is positively correlated with a load current $I_{LB}$ flowing through the amplifier circuit 6B.

Accordingly, the configuration of this embodiment is the same as that of the first embodiment described above except that the amplifier circuit 6 is changed to the amplifier circuits 6A and 6B and the sum of the load current-linked signals 65A and 65B is supplied to the PTr3 and the PTr4 via the SW4. Hereinafter, parts different from the first embodiment described above are described in detail, similar parts are denoted by the same symbols, and descriptions thereof are omitted as appropriate.

With reference to FIG. 10, the configuration of the load driving system 10 of this embodiment is described.

Here, FIG. 10 is a block diagram illustrating the configuration of the load driving system 10.

As illustrated in FIG. 10, the load driving system 10 includes the charge pump circuit 2, the clock generation circuit 4, the amplifier circuits 6A and 6B, and loads 8A and 8B.

From the amplifier circuit 6A, a conductive line L1 for transmitting the load current-linked signal 65A which is positively correlated with the load current $I_{LA}$ flowing through the amplifier circuit 6A extends toward the charge pump circuit 2 via a transistor NTr6A having a similar role to that of the NTr6 in the first embodiment described above.

In addition, from the amplifier circuit 6B, a conductive line L2 for transmitting the load current-linked signal 65B which is positively correlated with the load current $I_{LB}$ flowing through the amplifier circuit 6B extends toward the charge pump circuit 2 via a transistor NTr6B having a similar role to that of the NTr6 in the first embodiment described above.

Accordingly, in this embodiment, the NTr6A is provided in the amplifier circuit 6A, and the NTr6B is provided in the amplifier circuit 6B. It should be noted that the configuration in which the NTr6A and the NTr6B are provided in the charge pump circuit 2 may be adopted.

Further, the lines L1 and L2 are joined together before reaching the charge pump circuit 2 to become a line L3, and the line L3 is electrically connected to the SW4 of the charge pump circuit 2.

As a result, the load current-linked signal 65A flowing through the line L1 and the load current-linked signal 65B flowing through the line L2 meet each other, so that the load current-linked signal 65C which is a signal obtained by adding the load current-linked signal 65A and the load current-linked signal 65B together flows into the line L3.

Further, from the charge pump circuit 2, a conductive line L4 for supplying the power source of the voltage $V_{EE}$ extends toward the amplifier circuits 6A and 6B. The line L4 branches on the way into a line L5 which extends toward the amplifier circuit 6A and a line L6 which extends toward the amplifier circuit 6B. The lines L5 and L6 are electrically connected to negative power source supply terminals of the amplifier circuits 6A and 6B, respectively.

Accordingly, the load current $I_L$ flowing through the line L4 is a current obtained by adding the load current $I_{LA}$ flowing through the line L5 and the load current $I_{LB}$ flowing through the line L6 together ($I_L = I_{LA} + I_{LA}$).

For the sake of convenience in description, the description is given with the use of a term "line", but the present invention is not limited to the line as long as a conductive pattern capable of transmitting a signal is used. In addition, if the same state as described above can be brought about, any configuration, for example, the use of an adder may be adopted.

Further, the load 8A is a load which is driven by the amplifier circuit 6A, and the load 8B is a load which is driven by the amplifier circuit 6B.

In addition, although the amplifier circuits 6A and 6B are different from the amplifier circuit 6 of the first embodiment described above only in terms of input signals thereof ($S_{inA}$, $S_{inB}$) and the loads (8A, 8B) driven thereby (the contents may be the same), the amplifier circuits 6A and 6B have a similar configuration and operation to those of the amplifier circuit 6 of the first embodiment described above.

In addition, for the sake of convenience in description, the example illustrated in FIG. 10 adopts the configuration in which the two amplifier circuits 6A and 6B are driven, but the present invention is not limited thereto and may adopt the configuration in which three or more amplifier circuits are driven. In addition, the present invention is not limited to the amplifier circuits and may adopt the configuration in which a plurality of other driven circuits are driven. In addition, the configuration of this embodiment can be applied to the second embodiment described above.

With the configuration described above, in the charge pump circuit 2, during the period $\Phi 1$, the C1 can be charged with the supply current $I_s$ which is proportional to the load current-linked signal 65C.

As described above, in the load driving system 10 of this embodiment, the C1 can be charged with the supply current $I_{SUP}$ which is positively correlated with the current of the sum of the load currents $I_{LA}$ and $I_{LB}$ respectively flowing through the amplifier circuits 6A and 6B, the amplifier circuits 6A and 6B being the driven circuits of the charge pump circuit 2.

This makes it possible, for example, to efficiently drive a device including a plurality of amplifier circuits such as stereo headphone amplifiers.

In the third embodiment described above, the supply current control circuit 20 corresponds to the supply current amount control means according to any one of Inventions 1, 2, 5, 6, and 8.

Fourth Embodiment

Figure 11:
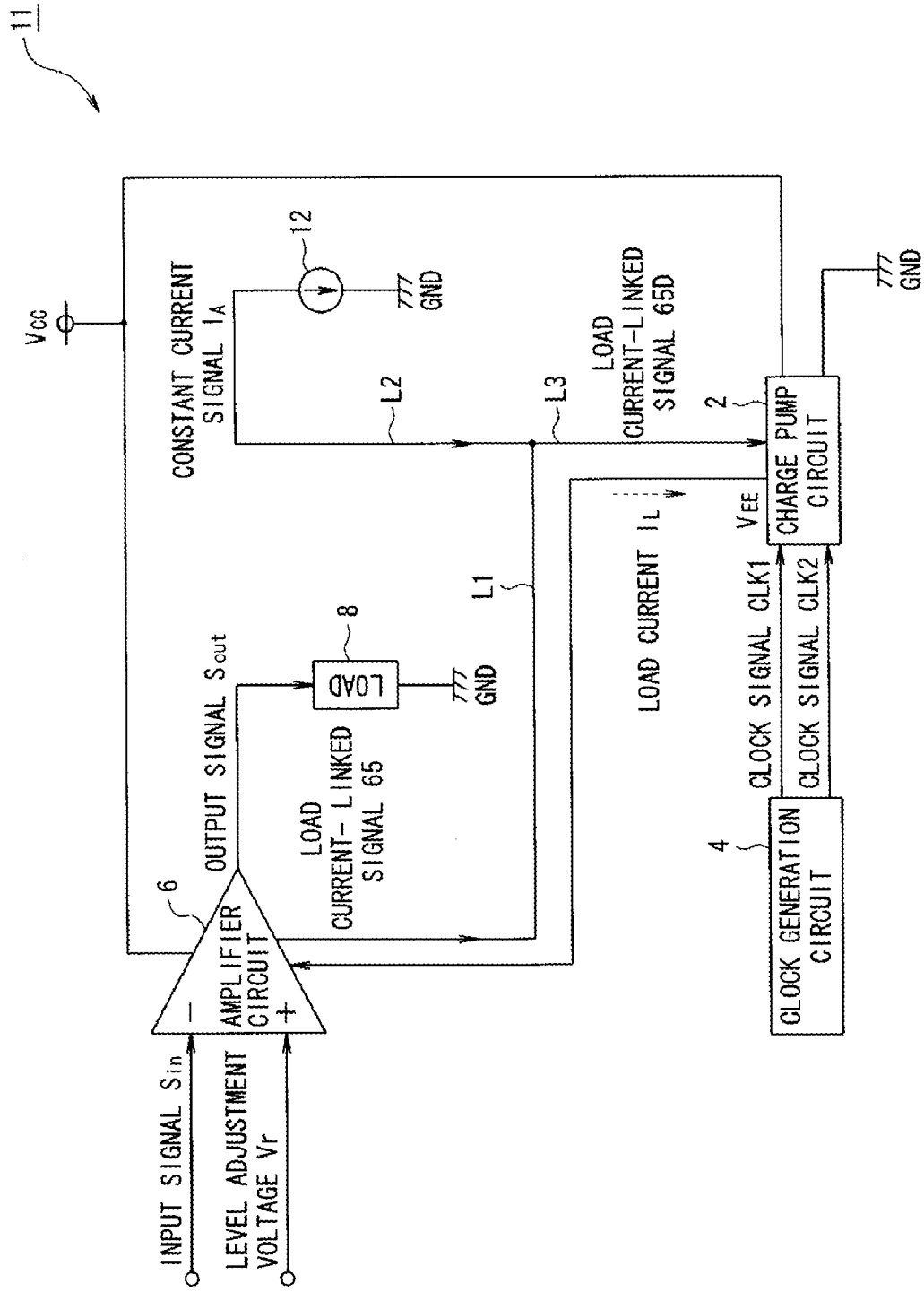
FIG. 11 is a block diagram illustrating a configuration of a load driving system 11.
Figure 12:
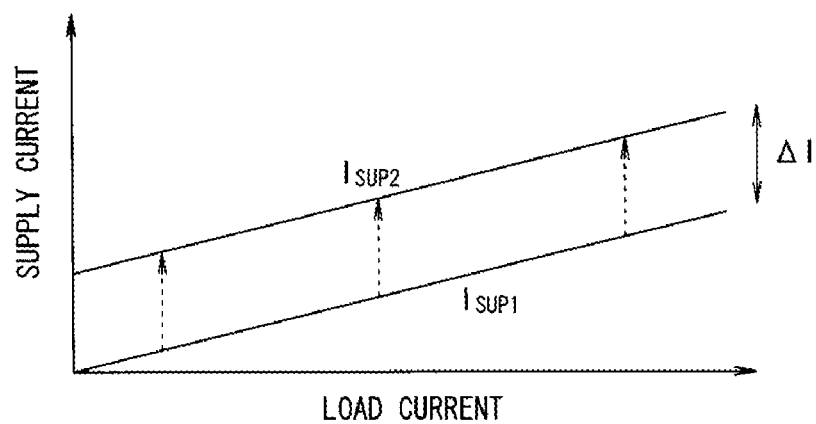
FIG. 12 is a graph showing a relation between supply currents $I_{SUP1}$ and $I_{SUP2}$ and the load current $I_L$.
Figure 13:
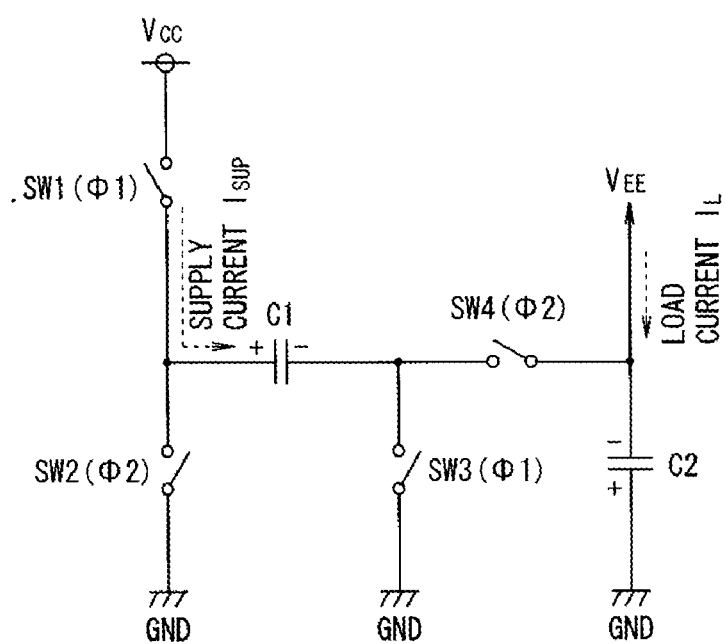
FIG. 13 is a diagram illustrating an example of a conventional charge pump circuit which drives a video amplifier.
Figure 14:
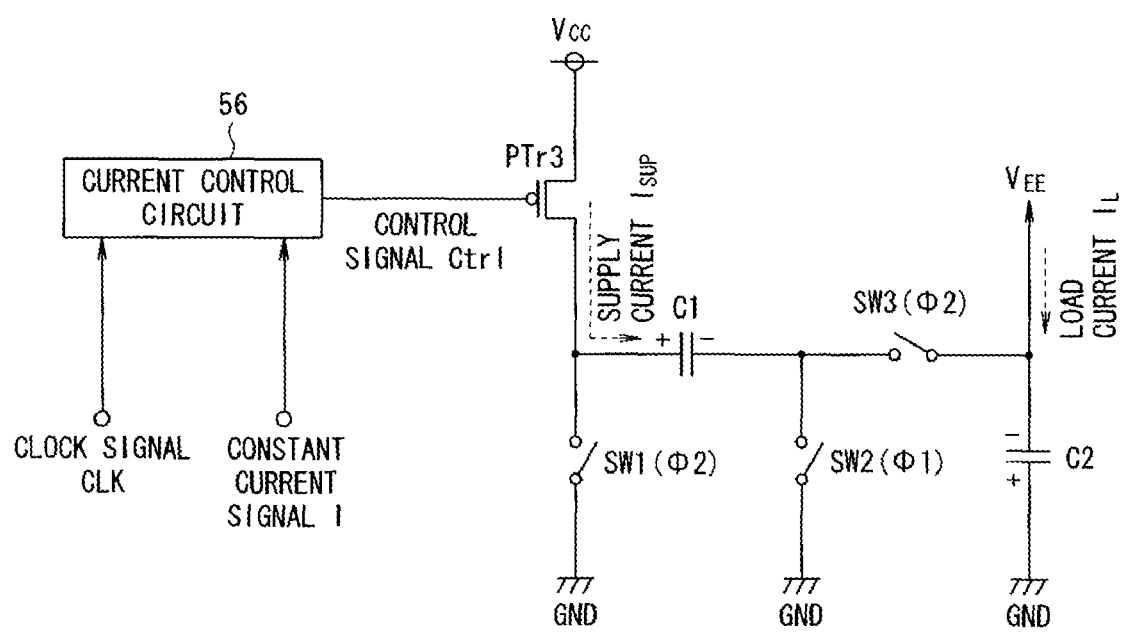
FIG. 14 is a diagram illustrating another example of the conventional charge pump circuit which drives the video amplifier.

Next, a fourth embodiment of the present invention is described with reference to the drawings. FIG. 11 and FIG. 12 are diagrams illustrating a charge pump circuit and a semiconductor integrated circuit according to the fourth embodiment of the present invention.

The load driving system 1 of the first embodiment described above has the configuration in which the charge pump circuit 2 charges the C1 with the supply current $I_{SUP}$ which is positively correlated with the load current $I_L$ flowing through the amplifier circuit 6. On the other hand, a load driving system 11 of this embodiment is different from the first embodiment described above in that a constant current having a preset level is added to the load current-linked signal 65 which is positively correlated with the load current $I_L$ to thereby generate a load current-linked signal 65D, and the C1 is charged with the supply current $I_{SUP}$ which is proportional to this generated signal.

Accordingly, this embodiment is the same as the first embodiment described above except that a constant current source for adding the constant current having a preset level to the load current-linked signal 65 is additionally provided. Hereinafter, parts different from the first embodiment described above are described in detail, similar parts are denoted by the same symbols, and descriptions thereof are omitted as appropriate.

With reference to FIG. 11, the configuration of the load driving system 11 of this embodiment is described.

Here, FIG. 11 is a block diagram illustrating the configuration of the load driving system 11.

As illustrated in FIG. 11, the load driving system 11 includes the charge pump circuit 2, the clock generation circuit 4, the amplifier circuit 6, the load 8, and a constant current source 12.

From the amplifier circuit 6, the conductive line L1 for transmitting the load current-linked signal 65 which is positively correlated with the load current $I_L$ flowing through the amplifier circuit 6 extends toward the charge pump circuit 2 via the NTr6.

Accordingly, in this embodiment, the NTr6 is provided in the amplifier circuit 6. It should be noted that the configuration in which the NTr6 is provided in the charge pump circuit 2 may be adopted.

The constant current source 12 has a function of outputting a constant current signal $I_A$ having a predetermined current level. From the constant current source 12, the conductive line L2 for transmitting the constant current signal $I_A$ extends toward the charge pump circuit 2.

The line L1 and the line L2 are joined together before reaching the charge pump circuit 2 to become the line L3, and the line L3 is electrically connected to the SW4 of the charge pump circuit 2.

As a result, the load current-linked signal 65 flowing through the line L1 and the constant current signal $I_A$ flowing through the line L2 meet each other, so that the load current-linked signal 65D which is a signal obtained by adding the load current-linked signal 65 and the constant current signal $I_A$ together flows into the line L3.

For the sake of convenience in description, the description is given with the use of a term "line", but the present invention is not limited to the line as long as a conductive pattern capable of transmitting a signal is used. If the same state as described above can be brought about, any configuration, for example, providing of an adder may be adopted.

With the configuration described above, during the period Φ1, the charge pump circuit 2 can charge the C1 with the supply current $I_{SUP}$ which is proportional to the load current-linked signal 65D.

Specifically, when the supply current in the first embodiment described above is represented by $I_{SUP1}$, the supply current in this embodiment is represented by $I_{SUP2}$, and an addition amount of the constant current signal $I_A$ is represented by Δ, as shown in FIG. 12, the supply current $I_{SUP2}$ always has a value obtained by adding the amount ΔI to the $I_{SUP1}$ compared with the supply current $I_{SUP1}$. Accordingly, the amount ΔI is set to an arbitrary value, whereby the C1 can be charged, without the restriction by the load current-linked signal 65, with the supply current $I_{SUP2}$ which is positively correlated with a signal having a current level higher by the amount ΔI than the load current-linked signal 65.

Here, FIG. 12 is a graph showing a relation between the load current $I_L$ and the supply current $I_{SUP1}$ needed at a minimum for driving the charge pump circuit 2 and a relation between the load current $I_L$ and the supply current $I_{SUP2}$ obtained by increasing the supply current $I_{SUP1}$ by a preset value.

As described above, in the load driving system 11 of this embodiment, the C1 can be charged with the supply current $I_{SUP}$ which is proportional to the load current-linked signal 65D, the load current-linked signal 65D being obtained by adding the constant current signal $I_A$ to the load current-linked signal 65 which is positively correlated with the load current $I_L$ flowing through the amplifier circuit 6, the amplifier circuit 6 being the driven circuit of the charge pump circuit 2.

As a result, even when the load current $I_L$ is 0 or the supply current amount fluctuates, the charge pump circuit 2 can be driven with a sufficient allowance by adding the constant current to thereby set the supply current $I_{SUP2}$ to a slightly large value.

In the fourth embodiment described above, the supply current control circuit 20 corresponds to the supply current amount control means according to any one of Inventions 1, 2, 3, 6, and 8.

It should be noted that the first to fourth embodiments described above each have the configuration of the charge pump circuit 2 or 3 in which, by means of the capacitors C1 and C2, the negative power source of the negative voltage $V_{EE}$ having substantially the same level as that of the voltage obtained by inverting the polarity of the positive voltage $V_{CC}$ is generated, but the present invention is not limited to this configuration and may adopt the configuration in which capacitors are connected at a larger number of stages to thereby generate a negative power source of a negative voltage having a voltage level multiplied according to the number of capacitors.

In addition, the first embodiment described above describes the configuration of the charge pump circuit 2 in which, when the negative power source of the negative voltage $V_{EE}$ having substantially the same level as that of the voltage obtained by inverting the polarity of the positive voltage $V_{CC}$ is generated, the load current-linked signal which is positively correlated with the load current $I_L$ flowing through the amplifier circuit 6 to which the negative power source is supplied is generated, so that the capacitor C1 is supplied with the supply current $I_{SUP}$ which is positively correlated with the load current $I_L$, but the present invention is not limited to this configuration.

For example, even in a case of using a charge pump circuit which generates a desired positive power source, it is possible to similarly generate the load current-linked signal.

In addition, in the first to fourth embodiments described above, the load current-linked signal 65 is generated by the NTr5 of the output stage circuit 62 and the NTr6 of the supply current control circuit 20, but the present invention is not limited thereto and the load current-linked signal 65 can also be generated with the use of the NTr3 of the input stage differential circuit 60.

In addition, in the first to fourth embodiments described above, the amplifier circuit is applied as the driven circuit, but the present invention is not limited thereto and other circuit such as an output buffer or a bias current supply circuit of a microphone element can be applied as the driven circuit.

It should be noted that, in the first to fourth embodiments described above, P-channel MOS transistors are used for configuring the PTr3 and the PTr4 which constitute the charge pump circuit 2 or 3, but the present invention is not limited thereto and N-channel MOS transistors may be used for configuring the PTr3 and the PTr4.

In addition, in the first to fourth embodiments described above, for the configuration of the semiconductor integrated circuit, MOS transistors are used for configuring the respective circuits, but the present invention is not limited to this configuration and other transistors such as bipolar transistors may be used for configuring the respective circuits.

In addition, the first to fourth embodiments described above are preferred specific examples of the present invention, and various technically preferable limitations are added thereto. However, the scope of the present invention is not limited to these embodiments unless there is a particular description to the effect that the present invention is limited. In addition, for the sake of convenience in illustration, the drawings used in the above description are schematic diagrams in which horizontally and vertically reduced scales of members or parts are different from actual scales thereof.

In addition, the present invention is not limited to the first to fourth embodiments described above and encompasses a modification, improvement, or the like within the range within which the object of the present invention can be achieved.

REFERENCE SIGNS LIST 1, 10, 11 . . . load driving system, 2, 3 . . . charge pump circuit, 4 . . . clock generation circuit, 6, 6A, 6B . . . amplifier circuit, 8, 8A, 8B . . . load, 12 . . . constant current source, 20, 21 . . . supply current control circuit, 22 . . . voltage monitor circuit, 23 . . . NOT circuit, 24 . . . AND circuit, 25 . . . subtraction circuit, 26 . . . comparator circuit, PTr1 to PTr4 . . . P-channel MOS transistor, NTr1 to NTr6 . . . N-channel MOS transistor, SW1 to SW4 . . . switching element, C1, C2, $C_{10}$ . . . capacitor, $R_s$, $R_f$, $R_{10}$ . . . resistor

The invention claimed is:

1. A charge pump circuit comprising:
an output power source generation circuit, including a capacitor for accumulating electric charges from an input power source, for alternately repeating a first state in which the electric charges from the input power source are accumulated in the capacitor and a second state in which the electric charges accumulated in the capacitor are transferred to a power source supply part, to thereby generate an output power source having a predetermined polarity; and
a supply current amount control circuit for controlling a supply amount of a current when the electric charges are accumulated in the capacitor, on the basis of an amount of a current output from a driven circuit which is driven by the output power source.

2. The charge pump circuit according to claim 1, wherein the supply current amount control circuit controls the amount of the current supplied to the capacitor so that a positive correlation is established between the amount of the current supplied to the capacitor and the amount of the current flowing through the driven circuit.

3. The charge pump circuit according to claim 2, wherein the supply current amount control circuit controls the amount of the current supplied to the capacitor so that the amount of the current supplied to the capacitor is larger by a preset amount than the amount of the current flowing through the driven circuit.

4. The charge pump circuit according to claim 1, further comprising:
voltage detection means for detecting a voltage between both ends of the capacitor;
voltage level comparison means for comparing a level of the voltage detected by the voltage detection means with a predetermined level; and
switching control means for switching, when the level of the detected voltage reaches the predetermined level in the first state according to a result of the comparison by the voltage level comparison means, the first state to the second state.

5. The charge pump circuit according to claim 1, wherein the supply current amount control circuit controls, when a plurality of the driven circuits are driven, the supply amount of the current when the electric charges are accumulated in the capacitor, on the basis of a sum of amounts of currents flowing through the plurality of the driven circuits.

6. The charge pump circuit according to claim 1, wherein the driven circuit is an amplifier circuit.

7. The charge pump circuit according to claim 6, wherein:
the supply current amount control circuit includes a current generation part for generating a second current proportional to a first current which is the current output from the amplifier circuit, the current generation part being in a current mirror relation with the first current; and
the supply current amount control circuit controls the supply amount of the current when the electric charges are accumulated in the capacitor, on the basis of the second current generated by the current generation part.

8. The charge pump circuit according to claim 1, which generates, based on the input power source, the output power source having a polarity opposite to a polarity of the input power source, wherein the power source supply part is configured to supply, to the driven circuit, a power within a voltage range between the output power source and the input power source.

9. A semiconductor integrated circuit which is formed by integrating a circuit comprising a charge pump circuit on a semiconductor substrate,
wherein the charge pump circuit comprises:
an output power source generation circuit, including a capacitor for accumulating electric charges from an input power source, for alternately repeating a first state in which the electric charges from the input power source are accumulated in the capacitor and a second state in which the electric charges accumulated in the capacitor are transferred to a power source supply part, to thereby generate an output power source having a predetermined polarity, and
a supply current amount control circuit for controlling a supply amount of a current when the electric charges are accumulated in the capacitor, on the basis of an amount of a current output from a driven circuit which is driven by the output power source.

10. A charge pump circuit comprising:
an output power source generation circuit, including a capacitor for accumulating electric charges from an input power source, for alternately repeating a first state in which the electric charges from the input power source are accumulated in the capacitor and a second state in which the electric charges accumulated in the capacitor are transferred to a power source supply part, to thereby generate an output power source having a predetermined polarity;
a supply current amount control circuit for controlling a supply amount of a current when the electric charges are accumulated in the capacitor, on the basis of an amount of a current flowing through a driven circuit which is driven by the output power source;
voltage detection means for detecting a voltage between both ends of the capacitor;
voltage level comparison means for comparing a level of the voltage detected by the voltage detection means with a predetermined level; and
switching control means for switching, when the level of the detected voltage reaches the predetermined level in the first state according to a result of the comparison by the voltage level comparison means, the first state to the second state.

11. A charge pump circuit comprising:
an output power source generation circuit, including a capacitor for accumulating electric charges from an input power source, for alternately repeating a first state in which the electric charges from the input power source are accumulated in the capacitor and a second state in which the electric charges accumulated in the capacitor are transferred to a power source supply part, to thereby generate an output power source having a predetermined polarity; and a supply current amount control circuit for controlling a supply amount of a current when the electric charges are accumulated in the capacitor, on the basis of an amount of a current flowing through a driven circuit which is driven by the output power source;

wherein the driven circuit is an amplifier circuit, wherein the supply current amount control circuit includes a current generation part for generating a second current proportional to a first current which is the current flowing through the amplifier circuit, the current generation part being in a current mirror relation with the first current, and wherein the supply current amount control circuit controls the supply amount of the current when the electric charges are accumulated in the capacitor, on the basis of the second current generated by the current generation part.

\* \* \* \* \*